United States Patent
Shah et al.

(10) Patent No.: US 10,319,432 B2
(45) Date of Patent: Jun. 11, 2019

(54) CIRCUITS FOR PULSE-WIDTH CONTROL IN MEMORY DEVICES AND RELATED METHODS

(71) Applicant: MEDIATEK Singapore Pte. Ltd., Singapore (SG)

(72) Inventors: Dharin Nayeshbhai Shah, Bangalore (IN); Manish Trivedi, Bengaluru (IN)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/801,733

(22) Filed: Nov. 2, 2017

(65) Prior Publication Data

US 2019/0013064 A1    Jan. 10, 2019

Related U.S. Application Data

(60) Provisional application No. 62/529,637, filed on Jul. 7, 2017.

(51) Int. Cl.
  *G11C 11/419*   (2006.01)
  *G11C 11/4091*  (2006.01)
  *G11C 7/08*     (2006.01)

(52) U.S. Cl.
  CPC .............. *G11C 11/419* (2013.01); *G11C 7/08* (2013.01); *G11C 11/4091* (2013.01)

(58) Field of Classification Search
  CPC ..... G11C 11/419; G11C 7/08; G11C 11/4091; G11C 7/1051; G11C 11/415
  See application file for complete search history.

(56) References Cited

U.S. PATENT DOCUMENTS

| | | | | |
|---|---|---|---|---|
| 8,988,932 B2* | 3/2015 | Ji | ........................... | G11C 11/419 365/154 |
| 2009/0045849 A1* | 2/2009 | Kim | ......................... | G11C 7/08 327/55 |
| 2014/0160873 A1* | 6/2014 | Shawwa | ................ | H03H 11/26 365/194 |
| 2015/0248923 A1* | 9/2015 | Lin | .......................... | G11C 7/08 365/189.15 |

\* cited by examiner

*Primary Examiner* — David Lam
(74) *Attorney, Agent, or Firm* — Wolf, Greenfield & Sacks, P.C.

(57) ABSTRACT

Control circuits for memory devices are described. The control circuits may be configured such that the duration of the pulses delivered to the sense amplifiers increases with increasing parasitic RC delays. That is, the larger the parasitic RC delay along a line connecting a drive circuit to the sense amplifiers, the larger the duration of the pulses delivered. In some embodiments, a feedback line may be inserted between the end of the output signal line and the drive circuit to route the control pulses back to the drive circuit. The drive circuit may be arranged such that the duration of the pulses with which the sense amplifiers are driven depends on the delay experienced along the feedback line. In this way, the longer the RC delay arising along the feedback line, the larger the durations of the pulses.

20 Claims, 9 Drawing Sheets

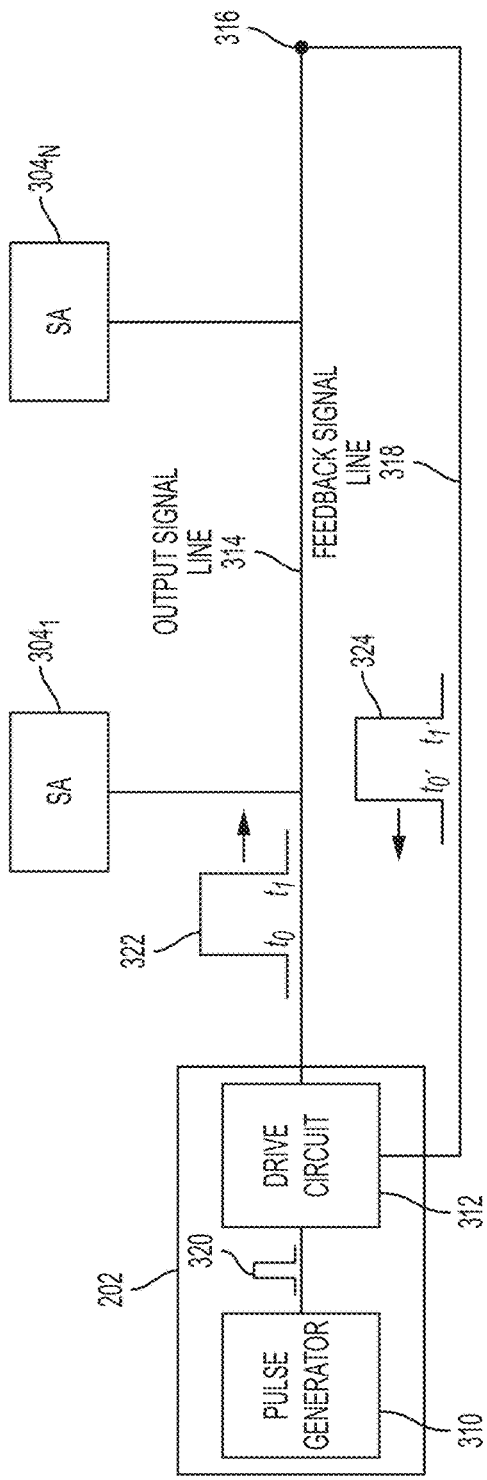
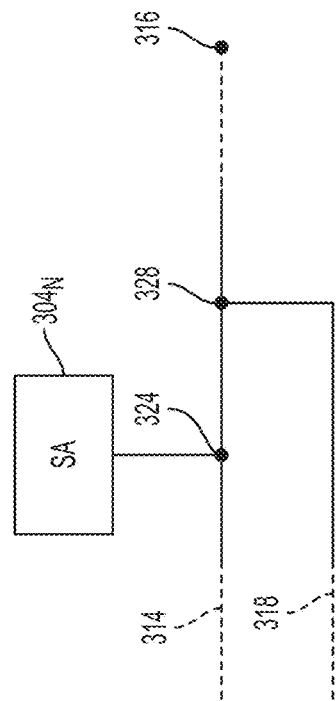
FIG. 3
FIG. 3A

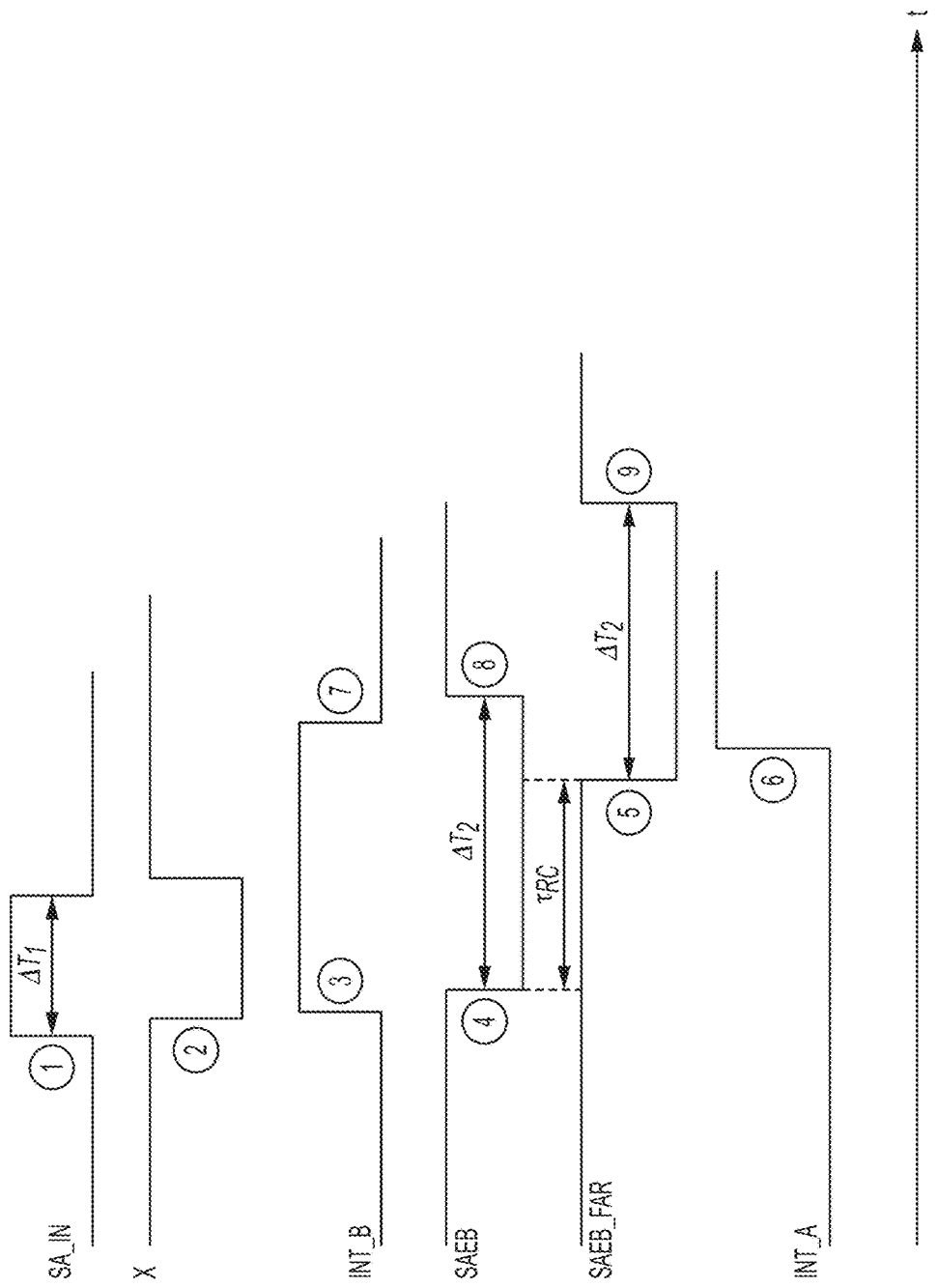

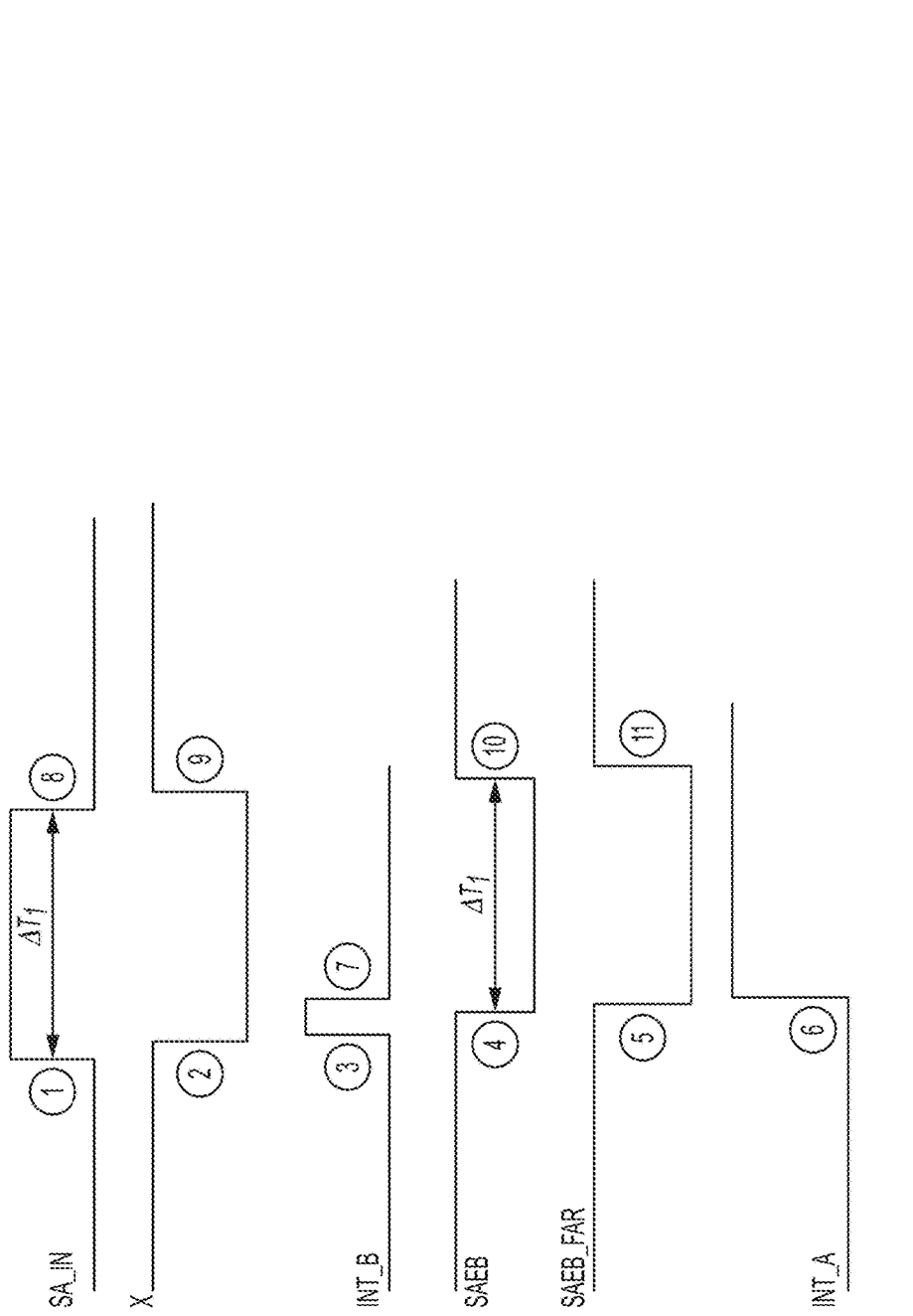

US 10,319,432 B2

CIRCUITS FOR PULSE-WIDTH CONTROL IN MEMORY DEVICES AND RELATED METHODS

RELATED APPLICATIONS

This Application claims priority under 35 U.S.C. § 119(e) to U.S. Provisional Application Ser. No. 62/529,637, entitled "PROCESS ADAPTIVE SENSEAMP PULSE-WIDTH CONTROL CIRCUITRY" filed on Jul. 7, 2017, which is herein incorporated by reference in its entirety.

BACKGROUND

Some memory devices, such as static random access memories (SRAM) use sense amplifiers to amplify the small differential signals generated across bitline pairs to recognizable logic levels.

BRIEF SUMMARY

Some embodiments are directed to a control circuit for a plurality of sense amplifiers of a memory. The control circuit may comprise a drive circuit configured to receive an input pulse and to provide an output signal to an output signal line to enable the plurality of sense amplifiers, wherein the output signal line is configured to feed back the output signal to the drive circuit as a feedback signal after the output signal has passed through the output signal line, and wherein the drive circuit is configured to produce the output signal with a timing that depends on a timing of the feedback signal.

Some embodiments are directed to a method for controlling a memory. The method may comprise: with a drive circuit, receiving an input pulse and generating an output signal in response to receiving the input pulse, enabling a plurality of sense amplifiers coupled to a plurality of memory cells with the output signal by providing the output signal to an output signal line, and feeding the output signal back to the drive circuit as a feedback signal after the output signal has passed through the output signal line, wherein the output signal has a timing that depends on a timing of the feedback signal.

Some embodiments are directed to a control circuit for a plurality of sense amplifiers of a memory. The control circuit may comprise a drive circuit, an output signal line coupled to the plurality of sense amplifiers, the output signal line having a proximal end coupled to the drive circuit and a distal end, and a feedback line coupled to the distal end of the output signal line and to the drive circuit.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 3 is a block diagram illustrating a memory having an output signal line for driving a plurality of sense amplifiers and a feedback line, according to some non-limiting embodiments.

FIG. 3A is a block diagram illustrating an example of a connection point between an output signal line and a feedback line, according to some non-limiting embodiments.

FIGS. 6A-6B are diagrams illustrating control signals generated by the system of FIG. 5, according to some non-limiting embodiments.

DETAILED DESCRIPTION

The inventors have appreciated that as semiconductor technologies continue to scale down in deep submicron nodes (e.g., less than 22 nm), delays caused by parasitic RC (resistive-capacitive) effects continue to increase. Such delays may degrade the performance of the electronic devices fabricated using these deep submicron nodes. In particular, some memories suffer from the fact that different sense amplifiers, and as a result the memory cells that are drive by the sense amplifiers, receive control pulses with non-uniform durations (control pulses are used to enable read operations). For example, a sense amplifier positioned closer to the drive circuit receives a control pulse having a certain duration, while sense amplifiers that are positioned farther away from the drive circuits receive narrower pulses due to the parasitic RC delays arising along the lines that connect these sense amplifiers to the drive circuits. Driving the sense amplifiers with inconsistent pulse durations may negatively affect the memory's ability to perform read operations.

Such inconsistencies in the duration of the pulses received by the sense amplifiers may be further exacerbated by process, voltage and temperature (PVT) variations, which render the resistance associated with a metal line unpredictable. In particular, memories fabricated using multi-patterning, a fabrication technique that utilizes multiple photolithographic steps to enhance feature density, often exhibit high resistance variations across the chip.

Figure 1:
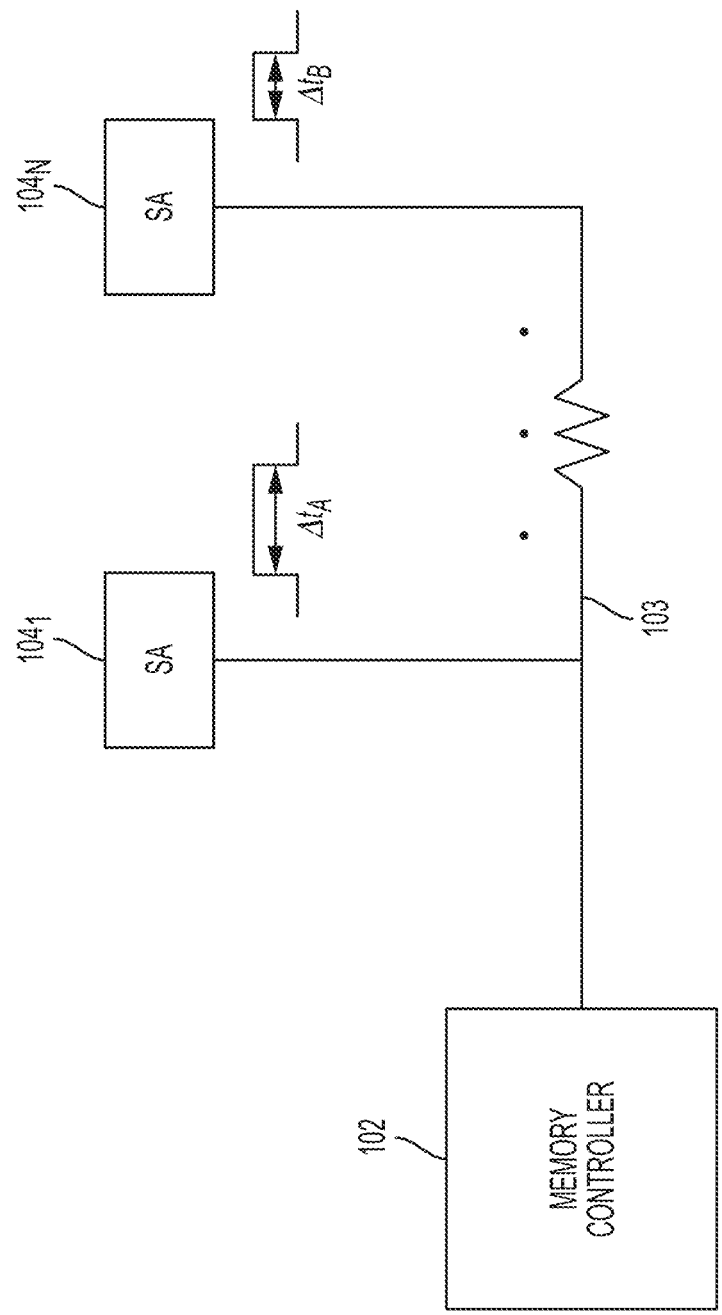
FIG. 1 is a block diagram illustrating a memory suffering from pulse narrowing.

FIG. 1 is a block diagram of a memory that suffers from pulse narrowing. As illustrated, the memory includes a memory controller 102 and multiple sense amplifiers (SA) $104_1 \ldots 104_N$. Each of the sense amplifiers enables read operations of a respective memory cell. Memory controller 102 generates control signals in the form of pulses that are delivered to the sense amplifiers via line 103. Line 103, which connects memory controller 102 to the sense amplifiers, exhibits a certain resistance along its length. Since the overall resistance between the sense amplifier $104_N$ and memory controller 102 is larger than the overall resistance between sense amplifier $104_1$ and memory controller 102, the RC (resistance/capacitance) constant is also increased. As a result, the steepness of the edges may be degraded, thus causing the pulse received by sense amplifier $104_N$ to be narrower than the pulse received by sense amplifier $104_1$. As shown, sense amplifier $104_1$ receives a pulse with a duration equal to $\Delta t_A$ while sense amplifier $104_N$ receives a pulse with a duration equal to $\times t_B$, where $\Delta t_B$ is less than $\Delta t_A$. As a result, the memory cells controlled by the two sense amplifiers are driven for different time durations, and inconsistencies in read operations may arise.

The inventors have developed drive circuits, for memories that employ sense amplifiers, that are configured such that the duration of the pulses delivered to the sense amplifiers increases with increasing parasitic RC delays. That is, the larger the parasitic RC delay along a line connecting a drive circuit to the sense amplifiers, the larger the duration of the pulses delivered. In this way, the negative effects of pulse narrowing due to parasitic RC delays can be mitigated, thus ensuring drive signal integrity and improving the overall performance of the memory.

In some embodiments, a feedback line may be inserted between the end of the output signal line (that is, the line connecting the drive circuit to the sense amplifiers), after the branch to the last sense amplifier on the line, and the drive circuit, to route the control pulses back to the drive circuit. The drive circuit may be arranged such that the duration of the pulses with which the sense amplifiers are driven depends on the delay experienced along the feedback line. In this way, the larger the RC delay arising along the feedback line, the larger the duration of the pulses.

Figure 2:
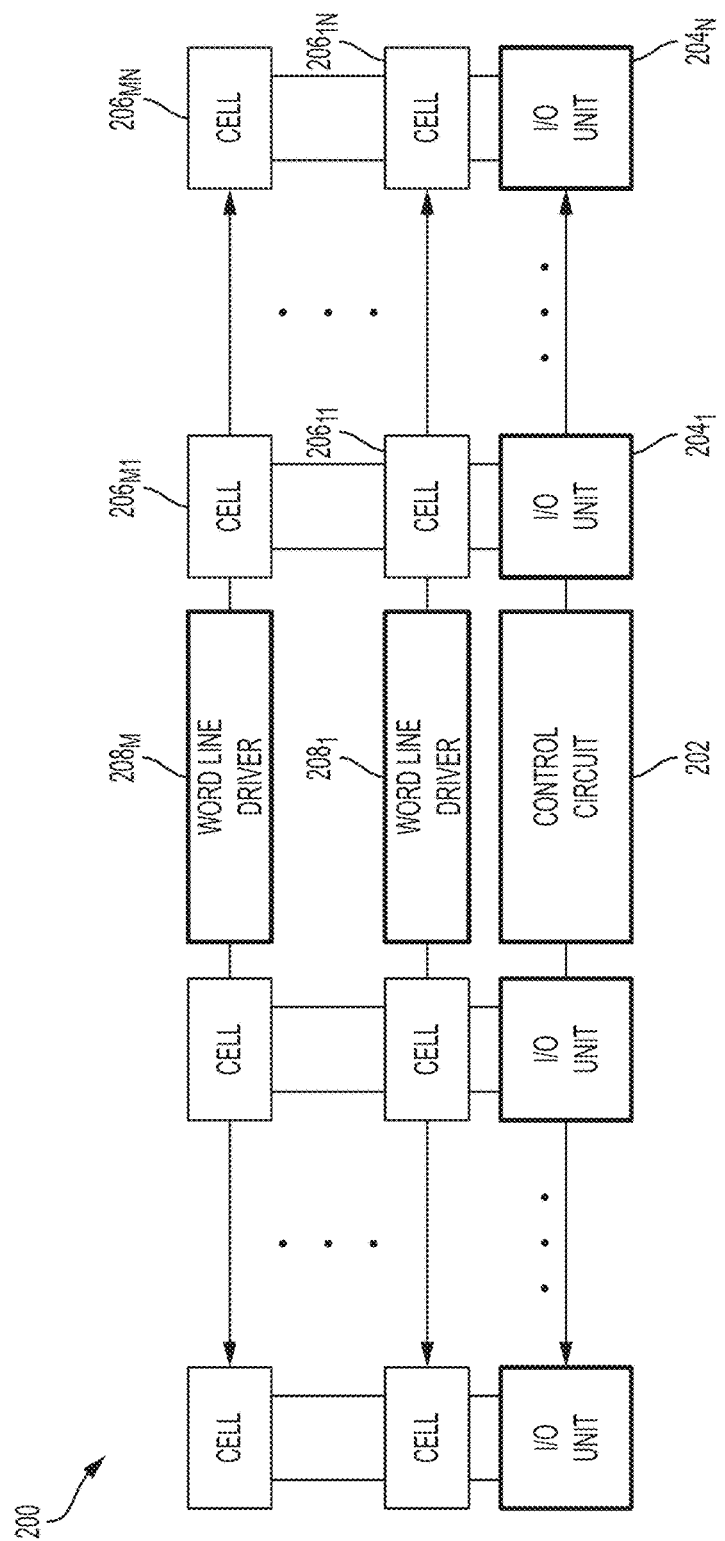
FIG. 2 is a block diagram illustrating a possible architecture for the memories described herein, according to some non-limiting embodiments.

FIG. 2 is a block diagram illustrating a possible architecture for the memories described herein. Memory 200 includes control circuit 202, input/output (I/O) units $204_1 \ldots 204_N$, memory cells $206_1 \ldots 206_{M1} \ldots 206_{1N} \ldots 206_{MN}$, and word line drivers $208_1 \ldots 208_M$. The memory cells may be arranged in rows and columns. In this example, the memory includes two blocks of M rows and N columns of memory cells. The bits stored in a row may form a word. The word line drivers may be used to perform read operations on respective rows of memory cells. Each I/O unit may include a sense amplifier for enabling operations on a column of memory cells. The sense amplifiers may be implemented in any of numerous ways. For example, a sense amplifier may have two transistors or less, four transistors or less, six transistors or less, eight transistors or less, twelve transistors or less, sixteen transistors or less, or any other suitable number of transistors. The sense amplifiers may be used for read, write and/or refresh operations, may operate in voltage mode or current mode, and may be arranged in a differential or non-differential configuration.

In some embodiments, control circuit 202 generates and delivers output signals to the sense amplifiers of the I/O units. The memory cells may be implemented, at least in some embodiments, using static random access memory (SRAM) cells. Alternatively, or additionally, other types of memory cells, such as dynamic random access memory (DRAMs) and flash memories, may be used.

In some embodiments, a feedback line may be introduced in parallel to the line with which the I/O units are driven. The feedback line may be used to provide an indication of the parasitic RC present in the memory. Control circuit 202 may control the duration of the pulse delivered to the I/O units based on the amount of delay accumulated along the feedback line.

FIG. 3 illustrates a memory including a feedback line. As illustrated, control circuit 202 includes pulse generator 310 and drive circuit 312, which is connected to sense amplifiers $304_1 \ldots 304_N$ via output signal line 314. Sense amplifier $304_1$ may be part of I/O unit $204_1$ and sense amplifier $304_N$ may be part of I/O unit $204_N$.

As illustrated, one side of output signal line 314 is connected to drive circuit 312. In addition, the other side of output signal line 314 is connected to drive circuit 312 via feedback line 318. In some embodiments, feedback line 318 is connected to the distal end (316) of output signal line 314. However, not all embodiments are limited in this respect, as feedback line 318 may alternatively be connected to an intermediate portion of output signal line 314. In some embodiments, as illustrated in FIG. 3A, feedback line 318 is connected to output signal line 314 at node 328. Node 328 may be positioned such that the farthest sense amplifier $304_N$ is connected to output signal line 314 at a node 324 that is between drive circuit 312 and node 328. Node 328 may or may not match with distal end 316.

Referring back to FIG. 3, drive circuit 312 may receive a pulse from pulse generator 310. In some embodiments, the pulse may be configured to enable operations of the sense amplifiers, for example for a read. In response to receiving pulse 320, drive circuit 312 may generate output signal 322, which may be delivered to the sense amplifiers via output signal line 314. In one example, output signal 322 exhibits an edge (such as a rising edge or a falling edge) at time $t_0$.

Output signal 322 may be fed back to drive circuit 312 via feedback line 318, as a feedback signal 324. In this example, feedback signal 324 exhibits an edge at time $t_0'$, which may be delayed relative to time $t_0$. In some embodiments, the delay between $t_0$ and $t_0'$ depends upon the parasitic RC existing along output signal line 314 and/or feedback line 318. Drive circuit 312 may be configured to trigger a second edge in the output signal 322 upon receiving the edge of feedback signal 324 occurring at time $t_0'$. In this example, the second edge of output signal 322 occurs at a time $t_1$. Since the second edge of output signal 322 is triggered by the first edge of feedback signal 324, time $t_1$ occurs after time $t_0'$. The second edge of the output signal 322 is subsequently delivered through feedback line 318 back to the drive circuit. Accordingly, feedback signal 324 exhibits a second edge at time $t_1'$.

The time duration of output pulse 322 ($t_1 - t_0$) may depend upon the delay introduced along the signal path from and back to drive circuit 312. In this way, narrowing of the pulses due to parasitic RC may be counteracted.

Figure 4:
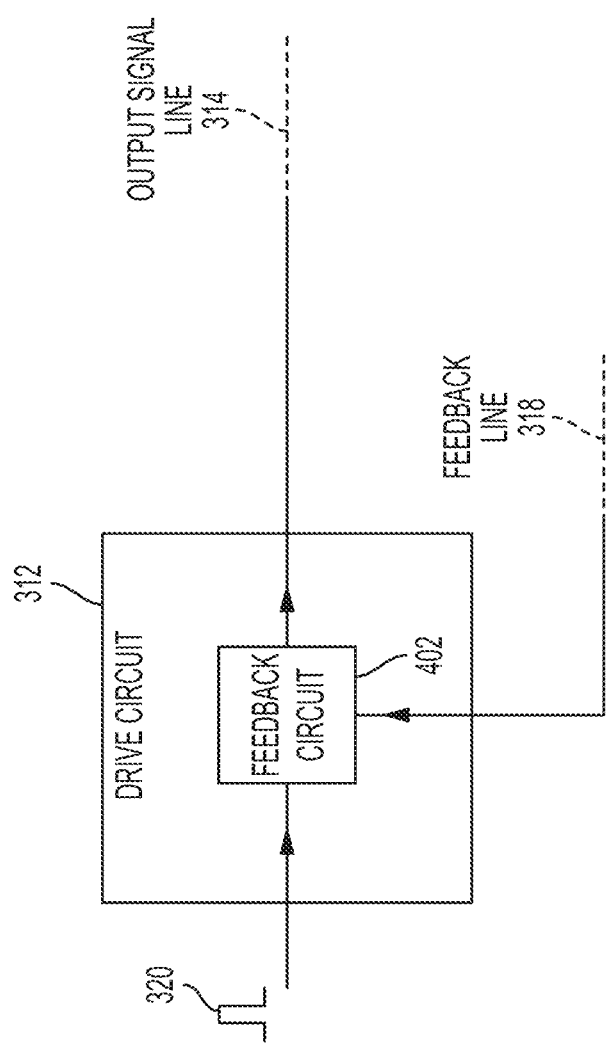
FIG. 4 is a block diagram illustrating a drive circuit having a feedback circuit, according to some non-limiting embodiments.

In some embodiments, drive circuit 312 may include a feedback circuit configured to trigger the second edge of output signal 322 when an edge in the feedback signal 324 is received. A drive circuit including a feedback circuit 402 is illustrated in FIG. 4. Feedback circuit 402 may be such that the level produced in the output signal line 314 depends, at least partially, upon the level of the received feedback signal 324. In some embodiments, feedback circuit 402 includes one input for receiving input pulse 320, one input connected to feedback line 318, and one output connected to output signal line 314.

Figure 5:
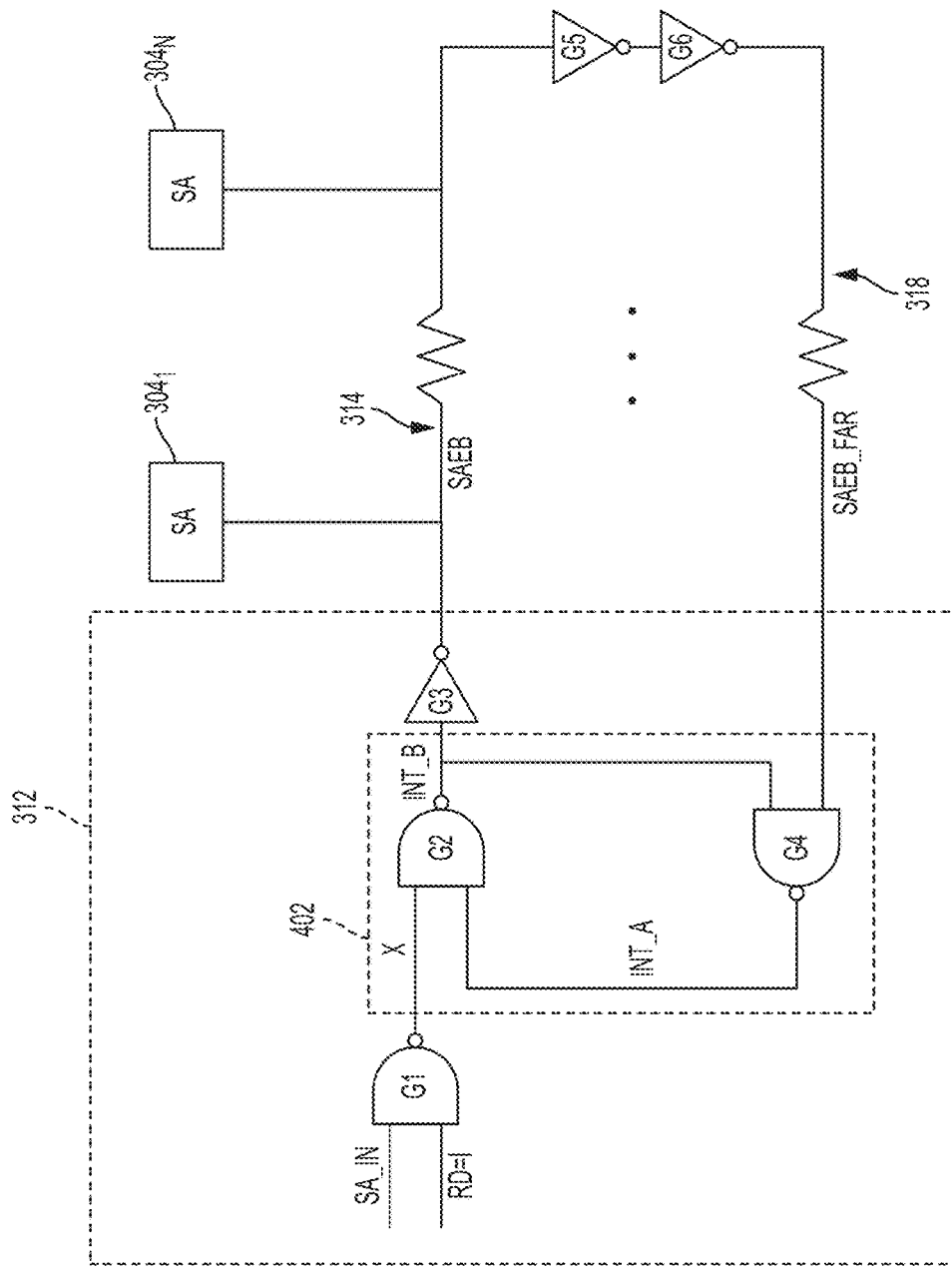
FIG. 5 is a block diagram illustrating a possible implementation for the memory of FIG. 3, according to some non-limiting embodiments.

A possible implementation for the drive circuit is illustrated in FIG. 5. As illustrated, drive circuit 312 includes logic gates G1, G2, G3 and G4. Logic gates G2 and G4 may collectively serve as feedback circuit 402. In the non-limiting example of FIG. 5, logic gates G1, G2 and G4 are NAND gates, and logic gate G3 is a NOT gate. However, not all embodiments are limited to these specific types of gates, as other logics may be used. Signal SA_IN may be provided by pulse generator 310 and may initiate the driver's operations. The signal RD may be set to 1, for example to cause the memory to operate in read mode. The output of logic gate G1 (signal X) may be provided as input to logic gate G2. The second input of logic gate G2 may be provided by logic gate G4 (signal INT_A). The output of logic gate G2

(signal INT_B) may be provided to logic gate G3 and to an input of logic gate G4. The output of logic gate G3 (signal SAEB) may be delivered to sense amplifiers $304_1 \ldots 304_N$ via output signal line 314. Feedback line 318 may be connected to output signal line 314 (for example, at the distal end of output signal line 314) via logic gates G5 and G6, which may serve as a signal buffer in some embodiments. Other types of signal buffers may be used in other embodiments. In yet other embodiments, no signal buffers are used between output signal line 314 and feedback line 318. The signal traveling down the feedback line 318 may be provided as second input to logic gate G4.

As illustrated in FIG. 5, feedback circuit 402 may receive signal INT_B and signal SAEB_FAR, which may be combined to generate signal INT_A. As such, drive circuit 312 may be viewed as having two feedback loops: the first feedback loop is provided through feedback line 318; the second feedback loop is provided inside the control circuit.

Operations of the circuit of FIG. 5 are illustrated in the non-limiting examples of FIGS. 6A-6B. It should be appreciated that the signals illustrated in these diagrams are provided solely by way of example, as the signals are not limited to the specific timing, polarities and shapes illustrated. The diagram of FIG. 6A illustrates a circumstance in which the overall delay due to parasitic RC is greater than the combined delays through the logic gates. This may be the case, for example, when the memory is fabricated using small technology nodes (e.g., less than 22 nm). By contrast, the diagram of FIG. 6B illustrates a circumstance in which the combined delays through the logic gates are larger than the overall delays due parasitic RC. This may be the case, for example, when the memory is fabricated using larger technology nodes.

The diagram of FIGS. 6A-6B illustrates events, which are indicated with numerals 1,2,3 .... Each event may indicate the occurrence of an edge in a signal (the time at which an edge occurs may be referred to herein as the time when the signal reaches 50% of the pre-transition level). The numerals are used to indicate the order in which the corresponding events occur. For example, event 1 occurs prior to event 2, which occurs prior to event 3, etc. FIGS. 6A-6B illustrate signals SA_IN, X, INT_B, SAEB, SAEB_FAR and INT_A as a function of time.

Referring first to FIG. 6A, signal SA_IN, which may be derived from input pulse 320, exhibits a rising edge (event 1). Assuming that signal RD=1, the occurrence of event 1 causes a falling edge in signal X (event 2). The occurrence of event 2 causes a rising edge in INT_B (event 3), which in turn causes a falling edge in signal SAEB (event 4). Signal SAEB is the signal driving the sense amplifiers.

Event 4 causes a falling edge in signal SAEB_FAR (event 5), which occurs with a delay $\tau_{RC}$ relative to event 4. The delay $\tau_{RC}$ is mainly due to parasitic RC along the signal path. In this example, the delay $\tau_{RC}$ is greater than the duration $\Delta T_1$ of the pulse corresponding to signal SA_IN, though not all embodiments are limited in this respect. The occurrence of event 5 causes a rising edge in signal INT_A (event 6). The occurrence of event 6 causes a falling edge in signal INT_B (event 7), which in turn causes a rising edge in signal SAEB (event 8). In this circumstance, the duration of the pulse corresponding to signal SAEB is $\Delta T_2$. In the embodiments in which the delay through the logic gates is negligible relative to the RC delay, duration $\Delta T_2$ is substantially equal to delay $\tau_{RC}$. In the example illustrated, $\Delta T_2$ is greater than $\tau_{RC}$ due to the presence of delays through the gates. The occurrence of event 8 causes a rising edge in signal SAEB_FAR (event 9) after a delay $\tau_{RC}$. The durations of the pulse corresponding to signal SAEB_FAR is substantially equal to $\Delta T_2$.

As illustrated in this example, the duration of the pulse used to enable the sense amplifier (signal SAEB) exhibits a duration that depends upon the parasitic RC. Specifically, the larger the parasitic, the wider the pulse. In this way, pulse narrowing effects are counteracted and the integrity of the memory's operations is preserved.

Referring now to FIG. 6B, event 1 causes event 2, which in turn causes event 3, which in turn causes event 4 (in a similar fashion as described in connection with FIG. 6A). However, in this case, the occurrence of event 5 is delayed mainly due to delays in the logic gates (logic gates G5 and G6 is this example), rather than parasitic RC delays. The occurrence of event 5 causes a rising edge in the signal INT_A (event 6), which in turn causes a falling edge in the signal INT_B (event 7). It should be appreciated that the duration of the pulse associated with signal INT_B is significantly narrower is comparison to the case of FIG. 6A.

In this example, it is assumed that the duration of the pulse associated with signal SA_IN ($\Delta T_1$) is greater than that of signal INT_B. The falling edge of signal SA_IN (event 8) causes a rising edge in the signals X (event 9), which in turn causes a rising edge in the signal SAEB (event 10). In this case, the duration of the pulse associated with signal SAEB is set by the second edge of signal SA_IN, rather than parasitic RC delays. Therefore, this drive circuit can be used whether or not the memory exhibits parasitic RC. In some embodiments, the duration of this pulse is substantially equal to $\Delta T_1$. The occurrence of event 10 causes a rising edge in signal SAEB_FAR (event 11). The durations of the pulse corresponding to signal SAEB_FAR is substantially equal to $\Delta T_1$.

Some of the techniques described herein may be used for controlling the timing of reset events within memories having multiple banks. Multi-bank memories of the types described herein may arranged such that they are reset when both a global reset signal and a local reset signal are received. The global reset signal may be configured to travel across different memory cells and to trigger generation of local reset signals. An exemplary circuit for controlling timing of the reset events in multi-bank memories is illustrated in FIG. 7.

Drive circuit 700 includes transistors $T_1$, $T_2$, $T_3$, $T_4$, $T_5$, and $T_6$, delay unit 705 and feedback circuit 702, and is arranged to operate as a local clock generator. In some embodiments, feedback circuit 702 may be implemented using logic gates $G_A$, $G_B$, and GC. $G_A$ and $G_B$ may be NAND gates and $G_C$ may be a NOT gate. The logic gates may be arranged such that the output of $G_A$ (signal MCKL) is fed as an input to $G_B$. Furthermore, the output of $G_A$ is fed through a bank of memories (such as SRAM, or DRAM memories). In some embodiments, signal MCLK is configured to reset the memories to which the drive circuit is connected. In this example, it will be assumed that a reset is provided when MCLK exhibits a falling edge. Of course, other logics may be used. In some embodiments, the drive circuit 700 may be configured such that internal clock is triggered by the arrival of an edge in the global clock CK. However, the duration of a MCLK pulse may be independent of the duration of the CK pulse. Rather, the duration of the MCLK pulse may depend on the feedback path through signal GSTR.

Figure 7:
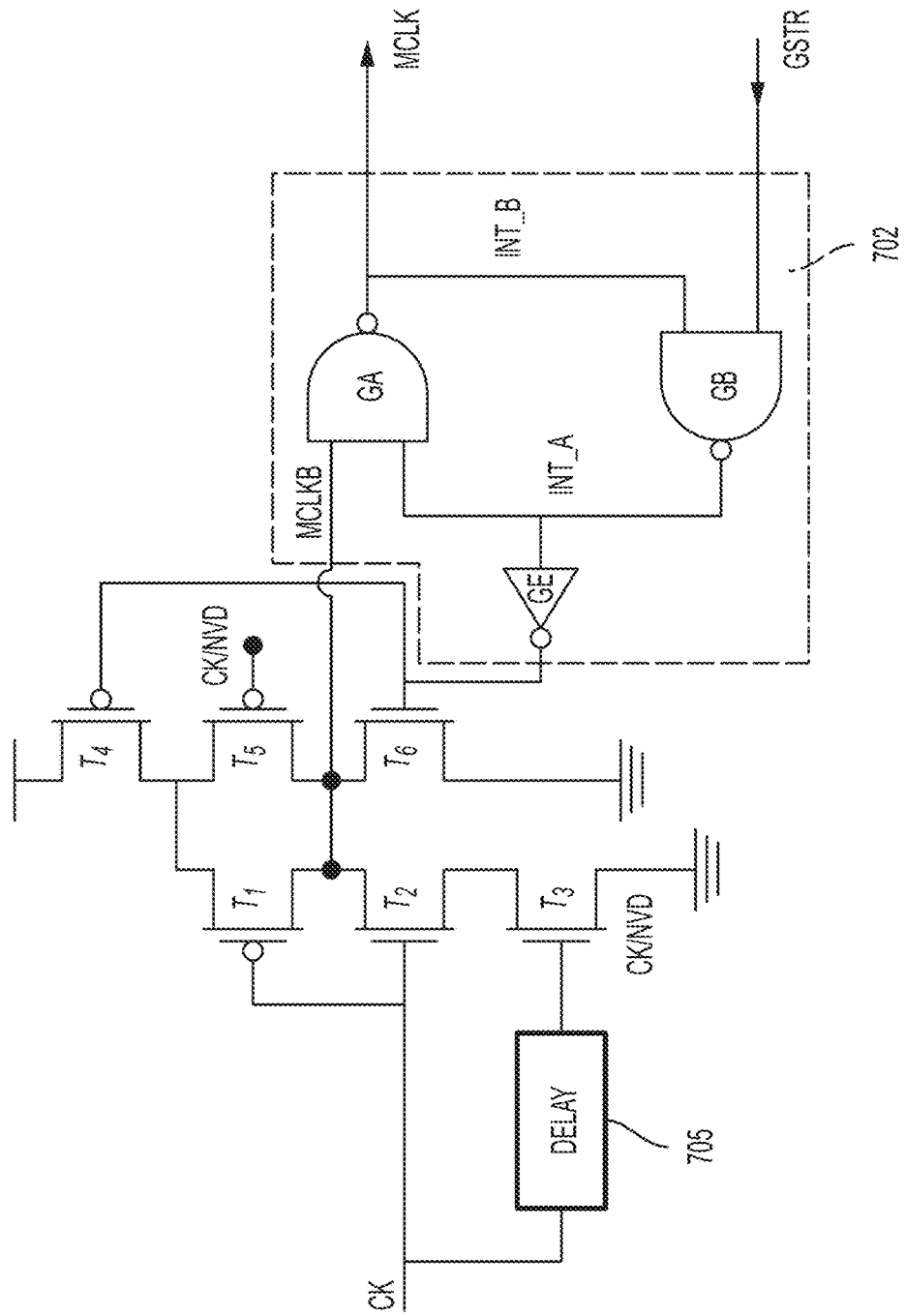
FIG. 7 illustrates an exemplary circuit for controlling timing of the reset events in multi-bank memories, according to some non-limiting embodiments.
Figure 8:
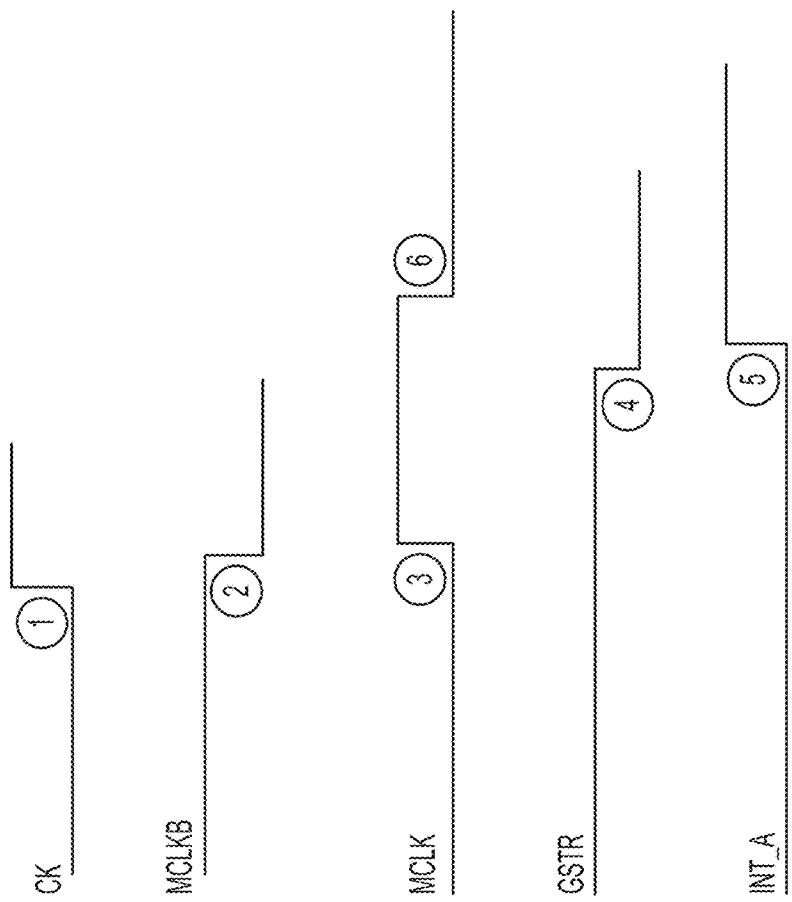
FIG. 8 illustrates the operations of the circuit of FIG. 7, according to some non-limiting embodiments.

Operations of the circuit of FIG. 7 are illustrated in the non-limiting example of FIG. 8. It should be appreciated that the signals illustrated in these diagrams are provided solely by way of example, as the signals are not limited to the specific timing, polarities and shapes illustrated. As in the cases described in connection with FIGS. 6A-6B, events are indicated with numerals. When a rising edge in the clock signal CK is received (event 1), transistors $T_2$ and $T_3$ are turned on, and as a result signal MCLKB exhibits a falling edge (event 2). As a result, signal MCLK exhibits a rising edge (event 3).

In this example, MCLK will not exhibit a falling edge (which causes a reset) until an is received in the GSTR (the global reset). When falling edge in the signal GSTR is received (event 4), this event causes a rising edge in signal INT_A (event 5), which in turn causes a falling edge in signal MCLK (event 6). Therefore, a reset signal is provided to the multi-bank memory only when the global reset is received.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A control circuit for a plurality of sense amplifiers of a memory, the control circuit comprising:
    a drive circuit configured to receive an input pulse and to provide an output signal, through an output signal line, to first and second sense amplifiers of the plurality of sense amplifiers, the first sense amplifier being configured to control operations of a first memory cell of the memory and the second sense amplifier being configured to control operations of a second memory cell of the memory, wherein the output signal line is configured to feed back the output signal to the drive circuit as a feedback signal after the output signal has passed through the output signal line, and
    wherein the drive circuit is configured to produce the output signal with a timing that depends on a timing of the feedback signal.

2. The control circuit of claim 1, wherein a duration of a pulse in the output signal depends on a delay that the feedback signal exhibits relative to the output signal.

3. The control circuit of claim 2, wherein the delay that the feedback signal exhibits relative to the output signal is caused by an RC effect.

4. The control circuit of claim 1, wherein the drive circuit comprises a feedback circuit.

5. The control circuit of claim 4, wherein the feedback circuit is configured to produce trailing edge in the output signal upon receiving leading edge in the feedback signal.

6. The control circuit of claim 4, wherein the trailing edge is a falling edge.

7. The control circuit of claim 1, wherein the first and second memory cells are part of different columns of memory cells.

8. The control circuit of claim 1, wherein the respective plurality of memory cells are static random access memory (SRAM) cells.

9. The control circuit of claim 1, further comprising a feedback line supporting propagation of the feedback signal, the feedback line being connected to an end of the output signal line.

10. The control circuit of claim 1, wherein the output signal exhibits a pulse that is wider than the input pulse.

11. A method for controlling a memory, the method comprising:
    with a drive circuit, receiving an input pulse and generating an output signal in response to receiving the input pulse;
    providing the output signal, through an output signal line, to first and second sense amplifiers of a plurality of sense amplifiers, the first sense amplifier being configured to control operations of a first memory cell of the memory and the second sense amplifier being configured to control operations of a second memory cell of the memory; and
    feeding the output signal back to the drive circuit as a feedback signal after the output signal has passed through the output signal line,
    wherein the output signal has a timing that depends on a timing of the feedback signal.

12. The method of claim 11, wherein a duration of a pulse in the output signal depends on a delay that the feedback signal exhibits relative to the output signal.

13. The method of claim 12, wherein the delay that the feedback signal exhibits relative to the output signal is caused by an RC effect.

14. The method of claim 11, further comprising producing a trailing edge in the output signal upon receiving a leading edge in the feedback signal.

15. The method of claim 14, wherein producing a trailing edge in the output signal comprises producing a falling edge in the output signal.

16. The method of claim 11, wherein the output signal exhibits a pulse that is wider than the input pulse.

17. A control circuit for a plurality of sense amplifiers of a memory, the control circuit comprising:
    a drive circuit;
    an output signal line coupled to first and second sense amplifiers of the plurality of sense amplifiers, the output signal line having a first end coupled to the drive circuit and a second end, the first sense amplifier being coupled to a first memory cell of the memory and the second sense amplifier being coupled to a second memory cell of the memory; and a feedback line coupled to the second end of the output signal line and to the drive circuit.

18. The control circuit of claim 17, wherein the drive circuit comprises a feedback circuit.

19. The control circuit of claim 18, wherein the feedback circuit is configured to provide trailing edge to the output signal line upon receiving a leading edge from the feedback line.

20. The control circuit of claim 19, wherein wherein the trailing edge is a falling edge.

* * * * *